United States Patent
Yoshimura et al.

[11] Patent Number: 6,100,724
[45] Date of Patent: Aug. 8, 2000

[54] DIGITAL SIGNAL REPRODUCING CIRCUIT

[75] Inventors: Shunji Yoshimura; Jumpei Kura, both of Tokyo, Japan

[73] Assignee: Sony Corporation, Tokyo, Japan

[21] Appl. No.: 09/037,333

[22] Filed: Mar. 10, 1998

[30] Foreign Application Priority Data

Mar. 18, 1997 [JP] Japan .................................. 9-064820

[51] Int. Cl.$^7$ ................................. G11B 7/00; H03L 7/06

[52] U.S. Cl. ......................... 327/100; 327/159; 327/150; 369/59; 375/371

[58] Field of Search ..................................... 327/141, 156, 327/147, 159, 150, 100; 360/65; 369/59, 44.25; 375/371

[56] References Cited

U.S. PATENT DOCUMENTS

5,812,508  9/1998  Moon ......................................... 369/69

*Primary Examiner*—Dinh T. Le
*Attorney, Agent, or Firm*—Frommer Lawrence & Haug, LLP.; William S. Frommer; Glenn F. Savit

[57] ABSTRACT

A digital signal reproducing circuit which enables precise measurement of a phase difference and jitter components of reproduction signals while realizing miniaturization of the circuit is disclosed. The digital signal reproducing circuit has a phase comparator for detecting a phase difference by using sampled values before and after an edge portion of a reproduction signal from an optical disc outputted from an A/D converter, and a jitter measuring section for detecting a jitter detection signal on the basis of unevenness of the phase difference obtained by the phase comparator.

14 Claims, 6 Drawing Sheets

DIGITAL SIGNAL REPRODUCING CIRCUIT

BACKGROUND OF THE INVENTION

1. Field of the Invention

This invention relates to a digital signal reproducing circuit for reproducing digital signals, and particularly to a digital signal reproducing circuit for reproducing signals while detecting the phase difference and jitter components of the signals to be reproduced.

2. Description of the Related Art

A digital signal reproducing circuit is adapted for reproducing digital data from an input analog signal, and has a synchronous clock reproducing section for generating a clock synchronous with the input analog signal, that is, a PLL circuit.

The synchronous clock reproducing section performs such control as to generate a clock substantially equal to the clock frequency of the input signal and generate a phase difference signal with a pulse width detected from the phase difference between the generated clock and the incoming signal, thus synchronizing the generated clock with the clock component of the incoming signal on the basis of the phase difference signal.

Figure 1:
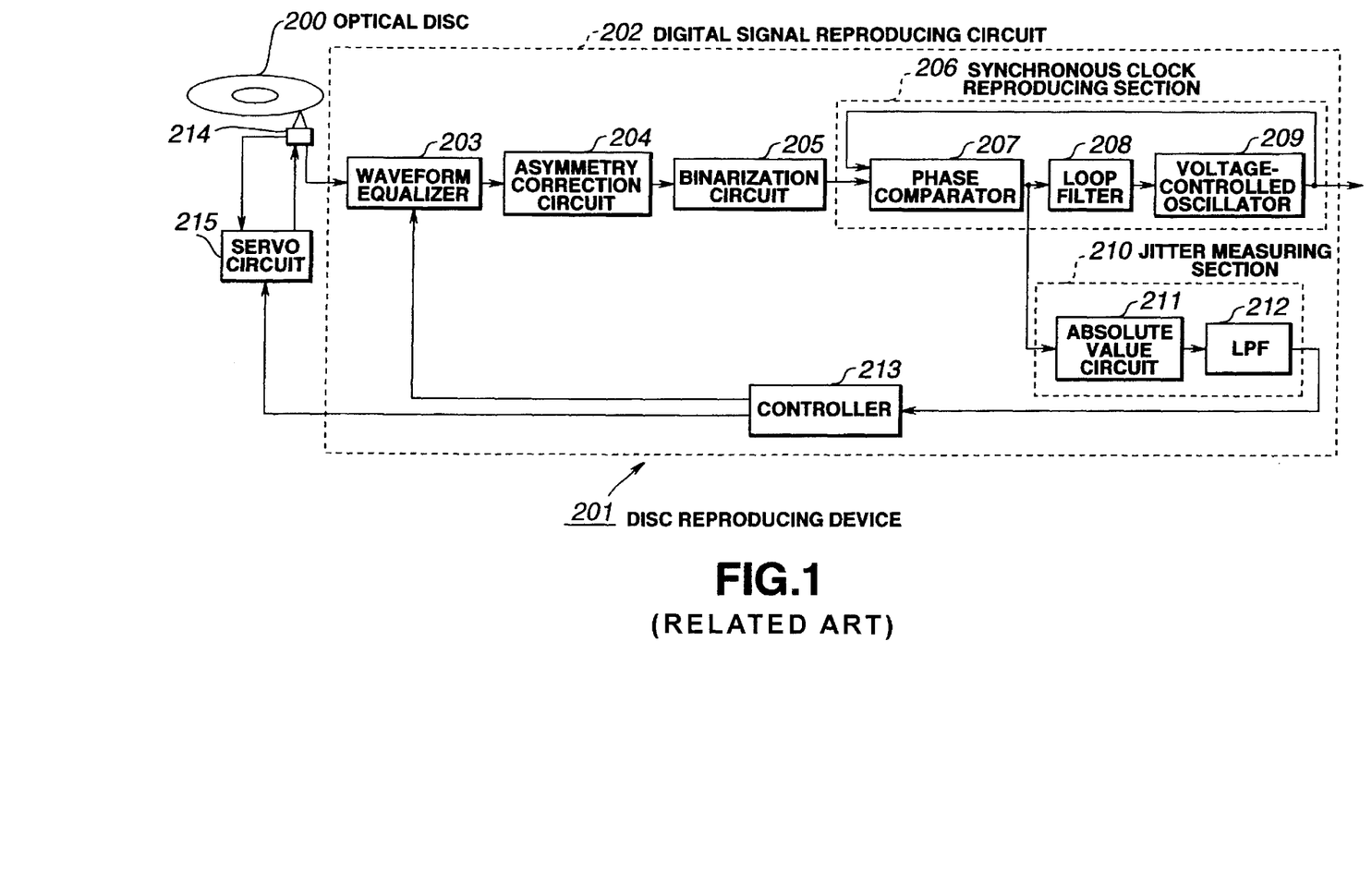
FIG. 1 is a circuit diagram showing the configuration of a conventional digital signal reproducing circuit.

In a disc reproducing device for reproducing signals recorded on, for example, an optical disc, a digital signal reproducing circuit 202 is included, as shown in FIG. 1.

The disc reproducing device 201 includes an optical pickup 214 for radiating a light onto an optical disc 200 so as to read signals recorded on the optical disc 200 on the basis of a return light of the radiated light, a waveform equalizer 203 for performing waveform equalization of reproduction signals outputted from the optical pickup 214 so as to output the waveform-equalized signals, an asymmetry correction circuit 204 for performing asymmetry correction of the signals outputted from the waveform equalizer 203 so as to output the asymmetry-corrected signals, and a binarization circuit 205 for converting the signals outputted from the asymmetry correction circuit 204 into binary signals so as to output the binary signals. The disc reproducing device 201 also includes a phase comparator 207 for outputting phase difference signals obtained by comparing the binary signals outputted from the binarization circuit 205 and a synchronous clock, a loop filter 208 for averaging the phase difference signals outputted from the phase comparator 207 in an analog manner so as to output the averaged signal, and a voltage-controlled oscillator 209 for generating a synchronous clock in such a manner that the signal outputted from the loop filter 208 becomes zero (0). In addition, the disc reproducing device 201 includes a jitter measuring circuit 210 which is constituted by an absolute value circuit 211 and a low-pass filter 212 and adapted for measuring jitter components on the basis of the phase difference signals outputted from the phase comparator 207, a servo circuit 215 for operating an objective lens by a biaxial actuator in the optical pickup 214 so as to perform focusing servo and tracking servo, and a controller 213 for controlling the servo circuit 215 and the waveform equalizer 203.

The phase comparator 207, the loop filter 208 and the voltage-controlled oscillator 209 constitute the synchronous clock reproducing section 206.

In the disc reproducing device 201, jitter components of the signals inputted to the disk reproducing device 201 are measured on the basis of the phase difference signals outputted from the comparator 207 of the synchronous clock reproducing section 206, and offset adjustment of tracking servo and focusing servo is carried out on the basis of the measured jitter detection signals.

For example, the jitter measuring section 210 for measuring jitter components is adapted for calculating jitter detection signals by digital processing. Thus, the jitter measuring section 210 measures phase difference signals as input pulses by high-frequency sampling clocks and averages absolute values thereof so as to calculate jitter detection signals. The controller 213 performs offset adjustment of servo on the basis of the jitter detection signals calculated by the jitter measuring section 210.

Meanwhile, analog processing is inferior in offset and operational precision to digital processing, though absolute values of pulse width may be averaged relatively easily in analog processing. Also, it is difficult to calculate the square average. Therefore, when jitter components are measured by analog processing, the offset or operational precision becomes inferior.

However, in order to carry out digital processing, phase difference pulses must be sampled with a time resolution equivalent to the required precision. That is, a clock of a frequency which is the reciprocal of the time resolution, or a high-precision delay circuit is required.

Thus, in view of the foregoing status of the art, it is an object of the present invention to provide a digital signal reproducing circuit which enables measurement of phase difference and jitter components with high precision while realizing miniaturization of the circuit.

SUMMARY OF THE INVENTION

According to the present invention, there is provided a digital signal reproducing circuit including phase comparing means for calculating a phase difference by using sampled values before and after an edge portion of an output signal from analog/digital converting means, and jitter measuring means for calculating unevenness of the phase difference provided by the phase comparing means.

DETAILED DESCRIPTION OF THE INVENTION

A digital signal reproducing circuit as an embodiment of the present invention will now be described in detail with reference to the drawings.

Figure 2:
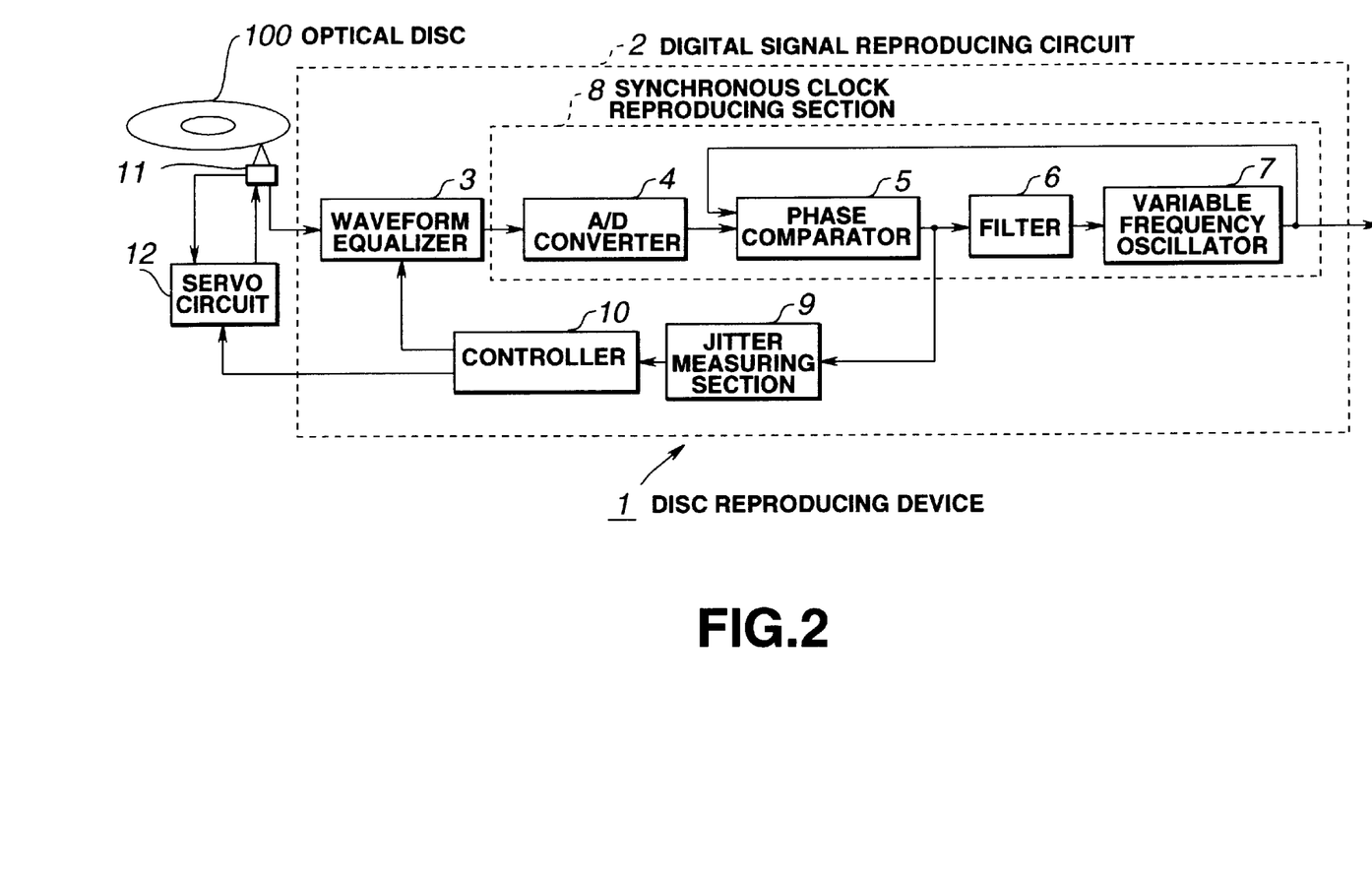
FIG. 2 is a circuit diagram showing the configuration of a disc reproducing device having a digital signal reproducing circuit as an embodiment of the present invention.

The digital signal reproducing circuit as the embodiment of the present invention is applied to a disc reproducing device 1 in which a light from an optical pickup 11 is radiated onto an optical disc 100 so that information signals are reproduced on the basis of a return light reflected on a signal recording surface of the optical disc 100, as shown in FIG. 2. This digital signal reproducing circuit is adapted for performing offset adjustment of focusing servo and tracking servo and controlling a waveform equalizer or the like, on the basis of jitter components detected from the reproduced information signals.

The digital signal reproducing circuit 2 constituted in the disc reproducing device 1 includes a waveform equalizer 3 for performing waveform equalization of reproduction signals outputted from the optical pickup 11 so as to output the waveform-equalized signals to an A/D converter 4, the A/D converter 4 for performing A/D conversion of the signals outputted from the waveform equalizer 3, a phase comparator 5 for calculating a phase difference by using sampled values before and after an edge portion of the signals outputted from the A/D converter 4, a filter 6 for smoothing the phase difference outputted from the phase comparator 5 so as to output a signal converted into a direct current, a variable frequency oscillator 7 for reproducing a synchronous clock on the basis of the signal outputted from the filter 6, a jitter measuring section 9 for detecting a jitter detection signal on the basis of unevenness of the phase difference obtained by the phase comparator 5, and a controller 10 for controlling the waveform equalizer 3 and a servo circuit 12, as later described, on the basis of the jitter detection signal outputted from the jitter measuring section 9.

In the digital signal reproducing circuit 2, the A/D converter 4, the phase comparator 5, the filter 6 and the variable frequency oscillator 7 constitute a synchronous clock reproducing section 8, that is, a PLL (phase-locked loop) circuit. The synchronous clock reproducing section 8 is adapted for reproducing a synchronous clock on the basis of a reproduction signal at the variable frequency oscillator 7 so as to synchronize the synchronous clock with the reproduction signal.

The disc reproducing device 1 includes the digital signal reproducing circuit 2, and also includes the optical pickup 11 for radiating a laser beam onto the signal recording surface of the optical disc 100 and receiving a return light thereof, and the servo circuit 12 for moving an objective lens, not shown, provided in the optical pickup 11 in the focusing direction and the tracking direction by a biaxial actuator.

By having the digital signal reproducing circuit 2 of the structure as described above, the disc reproducing device 1 controls the waveform equalizer 3 and the servo circuit 12 in such a manner that jitter components between reproduction signals from the optical disc 100 and synchronous clocks are reduced.

The structure of each circuit and section constituting the digital signal reproducing circuit 2 will now be described.

The waveform equalizer 3 performs waveform equalization of reproduction signals obtained from the optical disc 100. The waveform equalizer 3 is constituted as a filter circuit having a predetermined transfer function, and this transfer function is controlled by the controller 10 so that jitter components between reproduction signals and synchronous clocks are reduced. The reproduction signals which have been waveform-equalized by the waveform equalizer 3 are supplied to the A/D converter 4.

The A/D converter 4 converts the waveform-equalized reproduction signals as analog signals into digital signals. The sampling clock of the A/D converter 4 is the synchronous clock of the synchronous clock reproducing section 8.

For example, with respect to the digital video disc, it is prescribed that data are recorded on a recording medium at inversion intervals of 3T to 11T and 14T (where T denotes the cycle of the synchronous clock). Therefore, reproducibility is ensured even when the sampling clock of the A/D converter 4 is the frequency of the synchronous clock. The reproduction signals converted to digital data by the A/D converter 4 are supplied to the phase comparator 5 of the synchronous clock reproducing section 8.

To the phase comparator 5, the digital data of the reproduction signals are inputted. The phase comparator 5 and the jitter measuring section 9 detect a phase difference and a jitter detection signal, respectively, on the basis of the input digital data of the reproduction signals.

Figure 3:
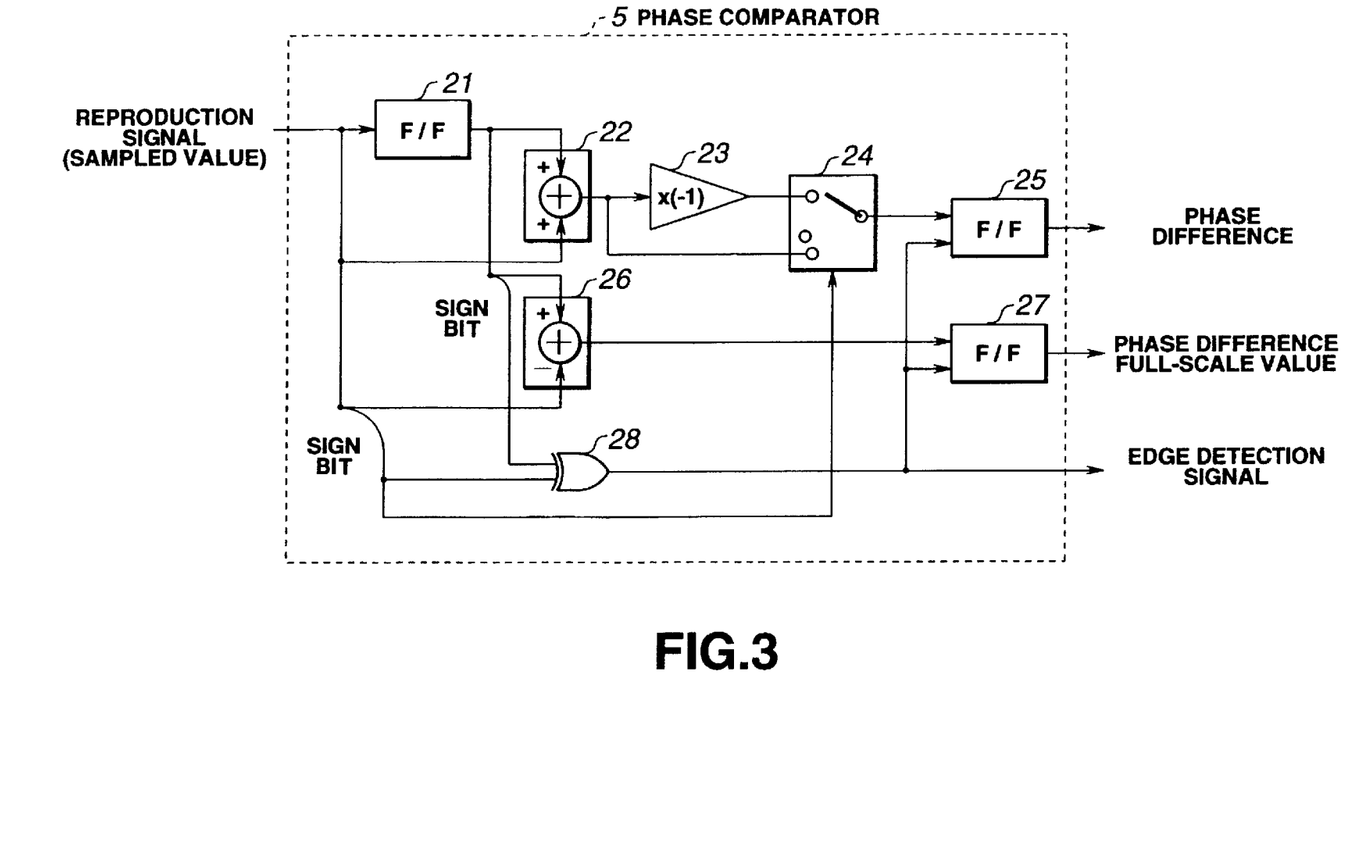
FIG. 3 is a circuit diagram showing the configuration of a phase comparator of the digital signal reproducing circuit.

The phase comparator 5 detects the phase difference between the reproduction signal and the synchronous clock. The phase comparator 5 includes, as shown in FIG. 3, a D-flip-flop circuit 21 as one-sample delay means, an adder 22 for adding a value from the A/D converter 4 to a value which is inputted thereto after being delayed by a synchronous clock unit through the D-flip-flop circuit 21, and a multiplier 23 for multiplying the value outputted from the adder 22 by −1. The phase comparator 5 also includes a changeover switch 24 for connecting the adder 22 with a D-flip-flop circuit 25 when a sign binary digit is 0 (+) and connecting the multiplier 23 with the D-flip-flop circuit 25 when the sign bit is 1 (−), the D-flip-flop circuit 25 operated by an edge detection signal detected by an EXOR (exclusive-OR) circuit 28 as later described, and a subtractor 26 for subtracting the value from the A/D converter 4 from the value outputted from the D-flip-flop circuit 21. The phase comparator 5 further includes a D-flip-flop circuit 27 operated by the edge detection signal detected by the EXOR circuit 28, and the EXOR circuit 28 for outputting an edge detection signal when detecting an edge of the reproduction signal. The EXOR circuit 28 outputs the edge detection signal when the input signal crosses a threshold value, as later described in detail.

The operation principle of phase difference detection will be described later with reference to FIGS. 5A to 5F and FIG. 6.

The phase comparator 5 outputs the phase difference of values before and after an edge portion obtained across the threshold value through the D-flip-flop circuit 21 the adder 22, the changeover switch 24 and the D-flip-flop circuit 25. Also, the phase comparator 5 outputs the difference of the values before and after the edge portion, that is, a full-scale value of the phase difference, through the D-flip-flop circuit 21, the subtractor 26 and the D-flip-flop circuit 27. In addition, the phase comparator 5 outputs an edge detection signal from the EXOR circuit 28 when the edge portion crosses the threshold value. The phase difference, the phase difference full-scale value and the edge detection signal which are outputted from the phase comparator 5 are inputted to the jitter measuring section 9.

Figure 4:
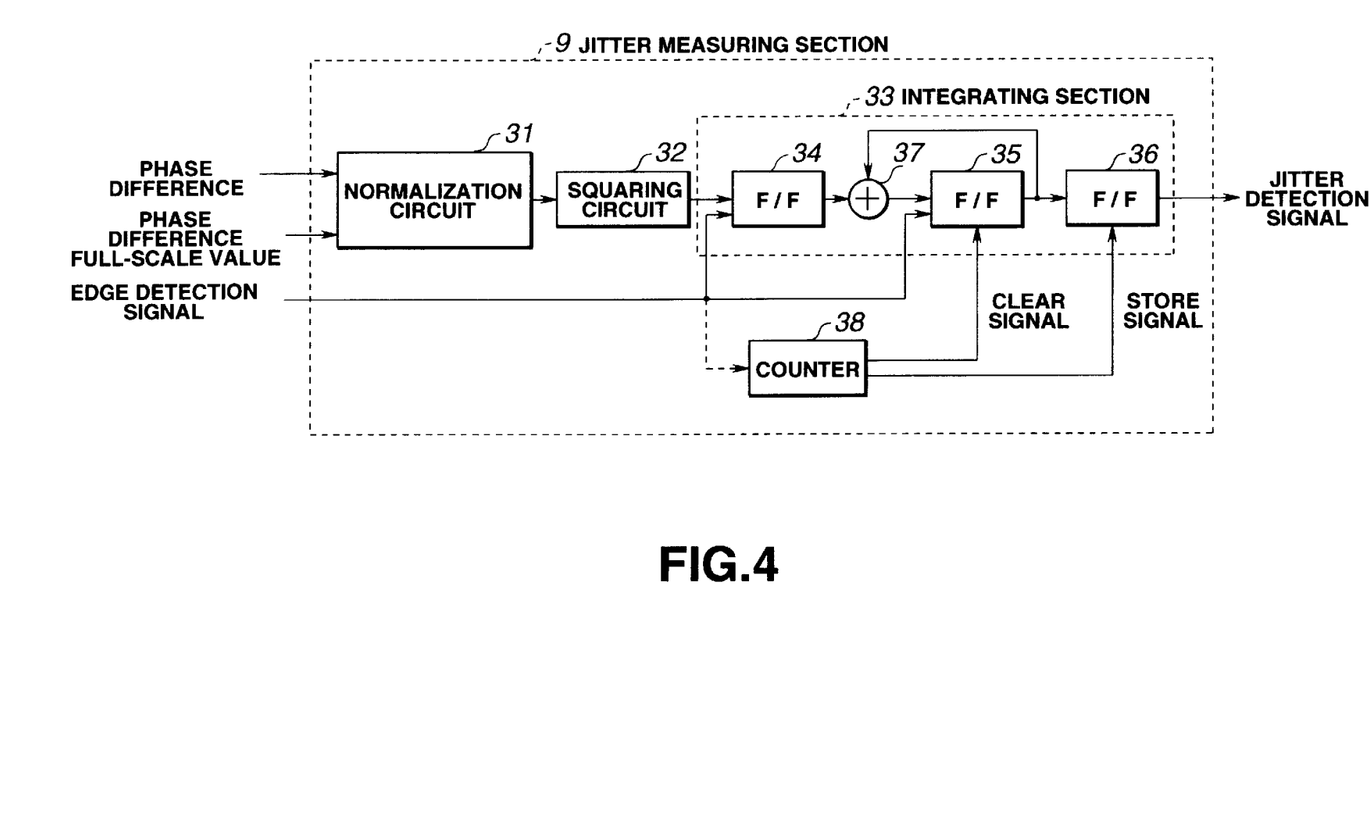
FIG. 4 is a circuit diagram showing the configuration of a jitter measuring section of the digital signal reproducing circuit.

The jitter measuring section 9 includes, as shown in FIG. 4, a normalization circuit 31 as a divider for normalizing the phase difference by the phase difference full-scale value, a squaring circuit 32 for squaring the phase difference normalized by the normalization circuit 31, an integrating section 33 for integrating the phase difference calculated by the squaring circuit 32, and a counter 38 for counting the edge detection signal from the phase comparator 5.

The integrating section 33 includes a D-flip-flop circuit 34 which is supplied with the phase difference squared by the squaring circuit 32 and operated by the edge detection signal, an adder 37 for adding the value from the D-flip-flop circuit 34 to a value from a D-flip-flop circuit 35 as later described, the D-flip-flop circuit 35 which is supplied with the signal outputted from the adder 37 and operated by the edge detection signal, and a D-flip-flop circuit 36 supplied with the signal outputted from the D-flip-flop circuit 35. In this integrating section 33, the value outputted from the squaring circuit 32 is integrated, and the integrated value is outputted when the counter exhibits a predetermined value.

Thus, the jitter measuring section 9 can detect a jitter detection signal as a square average phase difference which is normalized on the basis of the phase difference and the phase difference full-scale value inputted thereto.

When the counter 38 reaches a predetermined value, a clear signal is inputted to the D-flip-flop circuit 35 from the counter 38, and a store signal is inputted to the D-flip-flop circuit 36. On input of the clear signal, the D-flip-flop circuit 35 clears the stored value. On input of the store signal, the D-flip-flop circuit 36 stores and outputs the output from the D-flip-flop circuit 35. The signal outputted from the D-flip-flop circuit 36 becomes a jitter detection signal, which is inputted to the controller 10.

The integrating section 33 may also be constituted to output the phase difference integrated within a predetermined time period by using a timer or the like, instead of carrying out integration based on the count value of the edge.

In order to average the outputs from the jitter measuring section 9, for example, a divider for dividing the integrated phase difference by the number of input data is required. When the number of data to be integrated by the integrating section 33 is set to $2^n$ (where n is an integer), the integrated value to be outputted may be averaged by removing a bit shift or a low-order bit.

The jitter measuring section 9 may also have an absolute value circuit in place of the squaring circuit 32. In this case, calculation is reduced.

The controller 10 controls the waveform equalizer 3 in such a manner that the value of the jitter detection signal from the jitter measuring section 9 is reduced. For example, the controller 10 controls the transfer function of the waveform equalizer 3 so that jitter components between the reproduction signal and the synchronous clock are reduced.

Thus, the digital signal reproducing circuit 2 can detect the phase difference as digital data with high precision, without using a high-frequency sampling clock as in the conventional technique. In addition, the digital signal reproducing circuit 2 can detect the phase difference and jitter components on the basis of the phase difference of the digital data. Therefore, the digital signal reproducing circuit 2 can detect the phase difference and jitter components with high precision.

Also, since the calculated phase difference is normalized, the digital signal reproducing circuit 2 can precisely measure the jitter components even when the amplitude of the reproduction signal fluctuates.

Therefore, as the digital signal reproducing circuit 2 can precisely measure the jitter components, it can carry out correction of the synchronous clock with high precision.

The disc reproducing device 1 having this digital signal reproducing circuit 2 can reproduce signals having less deterioration. In addition, the disc reproducing device 1 can precisely carry out offset adjustment of the servo circuit 12 on the basis of the jitter detection signal.

The operation of phase difference detection in the digital signal reproducing circuit 2 will now be described. FIGS. 5A to 5F show reproduction signals inputted to the phase comparator 5. In this case, the digital signal reproducing circuit 2 detects the phase difference in accordance with the processing shown in the flowchart of FIG. 6.

The reproduction signals shown in FIGS. 5A to 5F, though continuously shown, are sampled on the basis of the synchronous clock at the input to the phase comparator 5. That is, the value of the reproduction signal is sampled as digital data in such a manner that the value from a threshold value V0 is converted by the A/D converter 4.

In FIGS. 5A to 5F, the threshold value V0 is a voltage 0 V, and a sampled value d(i−1) of the sampled reproduction signal is a value immediately before the edge portion crosses the threshold value V0. A signal d(i) is a sampled value immediately after the edge portion crosses the threshold value V0. That is, the sampling interval between the sampled value d(i−1) and the sampled value d(i) is equal to the interval of one unit of synchronous clock.

Figure 5A:
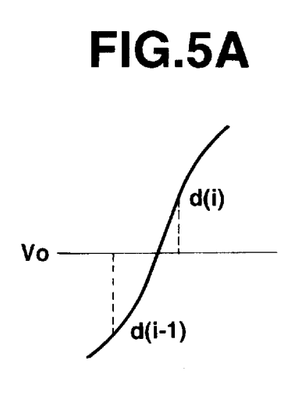
FIGS. 5A to 5F are graphs of reproduction signals illustrating reproduction signals inputted to the digital signal reproducing circuit.

When the reproduction signal has a phase delayed from the synchronous clock as viewed at a leading edge portion of the reproduction signal, the cross point (hereinafter referred to as the changing point) between the leading edge portion and the threshold value V0 is located after the intermediate point of the sampling interval, as shown in FIG. 5A. In this case, the sampled value d(i−1) and the sampled value d(i) are in the relations of $|d(i)|−|d(i−1)|$ and $d(i)+d(i−1)<0$.

Figure 5B:
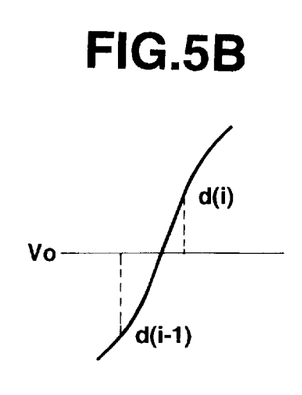
Figure 5C:
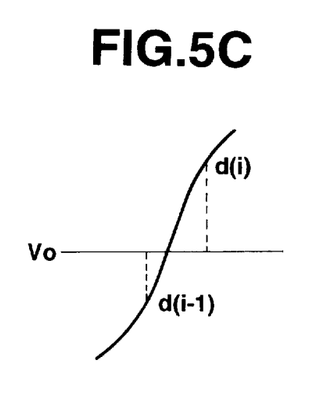
Figure 5D:
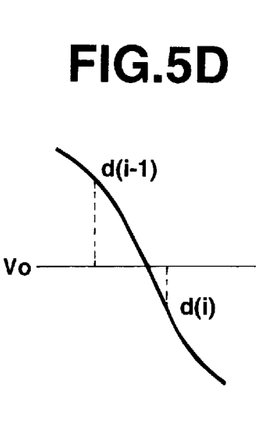

Also, when the reproduction signal has the phase delayed from the synchronous clock as viewed at a trailing edge portion of the reproduction signal, the changing point is located after the intermediate point of the sampling interval, as shown in FIG. 5D. In this case, the sampled value d(i−1) and the sampled value d(i) are in the relations of $|d(i)|<|d(i−1)|$ and $d(i)+d(i−1)>0$.

On the other hand, when the reproduction signal has a phase advanced from the synchronous clock as viewed at the leading edge portion of the reproduction signal, the changing point is located before the intermediate point of the sampling interval, as shown in FIG. 5C. In this case, the sampled value d(i−1) and the sampled value d(i) are in the relations of $|d(i)|>|d(i−1)|$ and $d(i)+d(i−1)>0$.

Figure 5E:
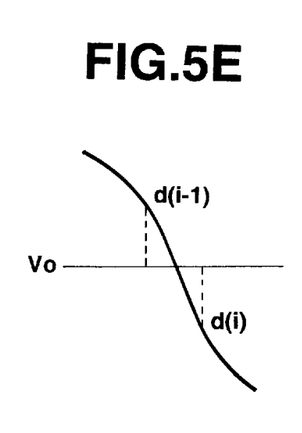
Figure 5F:
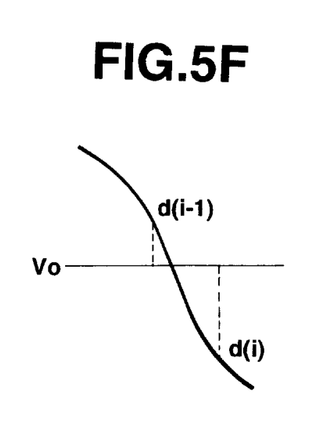

Also, when the reproduction signal has the phase advanced from the synchronous clock as viewed at the trailing edge portion of the reproduction signal, the changing point is located before the intermediate point of the sampling interval, as shown in FIG. 5F. In this case, the sampled value d(i−1) and the sampled value d(i) are in the relations of $|d(i)|>|d(i−1)|$ and $d(i)+d(i−1)<0$.

FIG. 5B shows the case where the reproduction signal is synchronized with the synchronous clock as viewed at the leading edge portion of the reproduction signal, and FIG. 5E shows the case where the reproduction signal is synchronized with the synchronous clock as viewed at the trailing edge portion of the reproduction signal. In both cases, the changing point is located at the intermediate point of the sampling interval. That is, the relation of $|d(i)|=|d(i−1)|$ is obtained.

On the basis of the sampled value d(i−1) and the sampled value d(i) before and after the edge portion which are obtained before and after the changing point of the reproduction signal, a phase difference $d(i)+d(i−1)$ is led out by the phase comparator 5, and a phase difference full-scale value $d(i−1)−d(i)$ is led out.

The EXOR circuit 28 of the phase comparator 5 compares sign of the sampled value d(i−1) and the sampled value d(i), and outputs an edge detection signal when the sign bits differ from each other.

Thus, since the D-flip-flop circuit 25 and the D-flip-flop circuit 27 are operated by the edge detection signal, only the phase difference and the phase difference full-scale value which have been calculated from the sampled values before and after the edge portion crossing the threshold value V0 are outputted to the jitter measuring section 9.

When the reproduction signal has the phase advanced from the synchronous clock as described above, $|d(i)|<|d(i-1)|$ is obtained at both leading and trailing edge portions. However, as the sign is reversed with respect to $d(i)+d(i-1)$, the changeover switch 24 of the phase comparator 5 outputs the phase difference from the adder 22 via the multiplier 23 to the D-flip-flop circuit 25 only in the case of the trailing edge portion.

Figure 6:
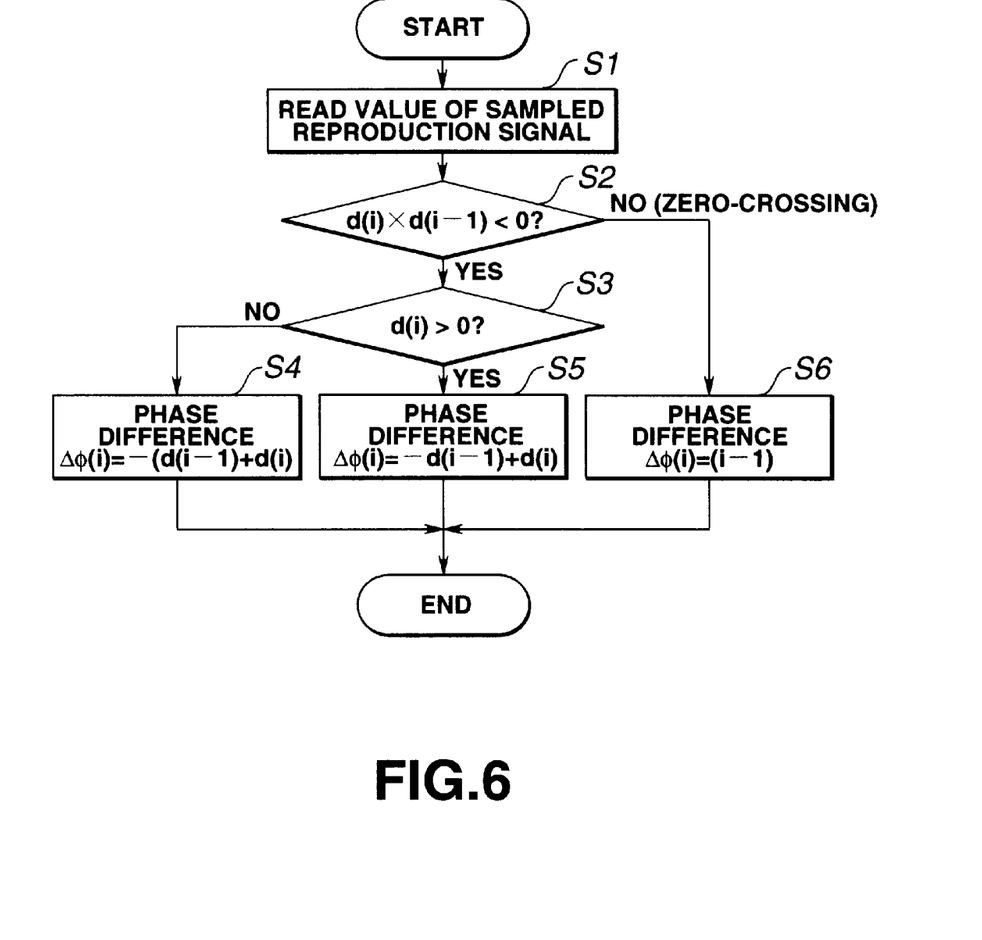
FIG. 6 is a flowchart illustrating a part of operation of the phase comparator.

Detection of the phase difference by the phase comparator 5 may also be described with reference to the flowchart of FIG. 6.

First, at step S1, the sampled value $d(i-1)$ and the sampled value $d(i)$ are continuously read through the D-flip-flop circuit 21. Then, at step S2, the sampled value $d(i-1)$ is multiplied by the sampled value $d(i)$, and whether the result of multiplication is negative or not is judged. If the result of multiplication is negative, the continuously obtained sampled value $d(i-1)$ and sampled value $d(i)$ take the values before and after the edge portion crossing the threshold value. In the phase comparator 5, the EXOR circuit 28 compares the sampled value $d(i-1)$ with the sampled value $d(i)$, and output to the jitter measuring section 9 is carried out on the basis of the result of comparison.

If the result of multiplication is negative, the operation proceeds to step S3. If the result of multiplication is positive, that is, if the reproduction signal does not cross the threshold value, the operation proceeds to step S6.

At step S3, it is confirmed that the sampled value $d(i)$ is positive or negative. If the sampled value $d(i)$ is negative, the sampled values $d(i-1)$ and $d(i)$ are values at the trailing edge portion. Then, a phase difference $\Delta\phi(i)=-(d(i-1)+d(i))$ is calculated at step S4.

On the other hand, if the sampled value $d(i)$ is positive, the sampled values $d(i-1)$ and $d(i)$ are values at the leading edge portion. Then, a phase difference $\Delta\phi(i)=d(i-1)+d(i)$ is calculated at step S5.

If the RF signal does not cross the threshold value, the phase difference is the previous phase difference $\Delta\phi(i)=\Delta\phi(i-1)$ at step S6.

With the phase differences thus calculated, an average value of the phase difference normalized by the jitter measuring section 9 is detected.

In place of the normalization circuit 31 for normalizing the phase difference on the basis of the phase difference and the phase difference full-scale value, a numerical table as shown in Table 1 may be used.

TABLE 1

| PE | PA | POUT |
|---|---|---|
| −8 | −8 | 255 |
| −7 | −8 | 196 |
| −6 | −8 | 144 |
| −5 | −8 | 100 |
| −4 | −8 | 64 |
| −3 | −8 | 36 |
| −2 | −8 | 16 |
| −1 | −8 | 4 |
| 1 | −8 | 4 |
| 2 | −8 | 16 |
| 3 | −8 | 36 |
| 4 | −8 | 64 |
| 5 | −8 | 100 |
| 6 | −8 | 144 |
| 7 | −8 | 196 |
| −7 | −7 | 255 |
| −6 | −7 | 188 |
| −5 | −7 | 131 |
| −4 | −7 | 84 |
| −3 | −7 | 47 |
| −2 | −7 | 21 |
| −1 | −7 | 5 |
| 0 | −7 | 0 |
| 1 | −7 | 5 |
| 2 | −7 | 21 |
| 3 | −7 | 47 |
| 4 | −7 | 84 |
| 5 | −7 | 131 |
| 6 | −7 | 188 |
| 7 | −7 | 255 |
| −6 | −6 | 255 |
| −5 | −6 | 178 |
| −4 | −6 | 114 |
| −3 | −6 | 64 |
| −2 | −6 | 28 |
| −1 | −6 | 7 |
| 0 | −6 | 0 |
| 1 | −6 | 7 |
| 2 | −6 | 28 |
| 3 | −6 | 64 |
| 4 | −6 | 114 |
| 5 | −6 | 178 |
| 6 | −6 | 255 |
| −5 | −5 | 255 |
| −4 | −5 | 164 |
| −3 | −5 | 92 |
| −3 | −5 | 41 |
| −1 | −5 | 10 |
| 0 | −5 | 0 |
| 1 | −5 | 10 |
| 2 | −5 | 41 |
| 3 | −5 | 92 |
| 4 | −5 | 164 |
| 5 | −5 | 255 |
| −4 | −4 | 255 |
| −3 | −4 | 144 |
| −2 | −4 | 64 |
| −1 | −4 | 16 |
| 0 | −4 | 0 |
| 1 | −4 | 16 |
| 2 | −4 | 64 |
| 3 | −4 | 144 |
| 4 | −4 | 255 |
| −3 | −3 | 255 |
| −2 | −3 | 114 |
| −1 | −3 | 28 |
| 0 | −3 | 0 |
| 1 | −3 | 28 |
| 2 | −3 | 114 |
| 3 | −3 | 255 |
| −2 | −2 | 255 |
| −1 | −2 | 64 |
| 0 | −2 | 0 |
| 1 | −2 | 64 |
| 2 | −2 | 255 |
| −1 | −1 | 255 |
| 0 | −1 | 0 |
| 1 | −1 | 255 |
| −1 | 1 | 255 |
| 0 | 1 | 0 |
| 1 | 1 | 255 |
| −2 | 2 | 255 |
| −1 | 2 | 64 |
| 0 | 2 | 0 |
| 1 | 2 | 64 |
| 2 | 2 | 255 |

TABLE 1-continued

| PE | PA | POUT |
|---|---|---|
| −3 | 2 | 255 |
| −2 | 3 | 114 |
| −1 | 3 | 28 |
| 0 | 3 | 0 |
| 1 | 3 | 28 |
| 2 | 3 | 114 |
| 3 | 3 | 255 |
| −4 | 4 | 255 |
| −3 | 4 | 144 |
| −2 | 4 | 64 |
| −1 | 4 | 16 |
| 0 | 4 | 0 |
| 1 | 4 | 16 |
| 2 | 4 | 64 |
| 3 | 4 | 144 |
| 4 | 4 | 255 |
| −5 | 5 | 255 |
| −4 | 5 | 164 |
| −3 | 5 | 92 |
| −2 | 5 | 41 |
| −1 | 5 | 10 |
| 0 | 5 | 0 |
| 1 | 5 | 10 |
| 2 | 5 | 41 |
| 3 | 5 | 92 |
| 4 | 5 | 164 |
| 5 | 5 | 255 |
| −6 | 6 | 255 |
| −5 | 6 | 178 |
| −4 | 6 | 114 |
| −3 | 6 | 64 |
| −2 | 6 | 28 |
| −1 | 6 | 7 |
| 0 | 6 | 0 |
| 1 | 6 | 7 |
| 2 | 6 | 28 |
| 3 | 6 | 64 |
| 4 | 6 | 114 |
| 5 | 6 | 178 |
| 6 | 6 | 255 |
| −7 | 7 | 255 |
| −6 | 7 | 188 |
| −5 | 7 | 131 |
| −4 | 7 | 84 |
| −3 | 7 | 47 |
| −2 | 7 | 21 |
| −1 | 7 | 5 |
| 0 | 7 | 0 |
| 1 | 7 | 5 |
| 2 | 7 | 21 |
| 3 | 7 | 47 |
| 4 | 7 | 85 |
| 5 | 7 | 131 |
| 6 | 7 | 188 |
| 7 | 7 | 255 |

The numerical table shown in Table 1 is constituted by the phase difference (PE), the phase difference full-scale value (PA) and the normalized phase difference (POUT).

The normalized phase difference (POUT) is determined to be POUT=(PE/PA)2×256. In Table 1, the relation of $|PE|>|PA|$ holds on the basis of the definition of the phase difference and the phase difference full-scale value.

Thus, as the numerical table is used, no computing circuit is required. Therefore, the normalized phase difference may be led out by a small-scale circuit.

If a phase difference or a phase difference full-scale value which is not on the table is inputted, protection from operation errors may be carried out by outputting 0 or the like. Also, arbitrary values may be allocated so as to reduce the circuit scale.

Also, the squaring circuit and the absolution value circuit can calculate the square value and the absolute value, respectively, of the phase difference, by using the table as described above. In addition, by integrating the normalization and the square average or absolute value average, the normalized phase difference average may be detected when the phase difference and the phase difference full-scale value are inputted.

Thus, since the digital signal reproducing circuit 2 measures the phase difference and jitter components on the basis of digital data, it can synchronize the reproduction signal with the synchronous clock with high precision.

The digital signal reproducing circuit according to the present invention has phase comparing means for detecting a phase difference from sampled values before and after an edge portion of a reproduction signal, thus enabling detection of the phase difference as digital data. Also, the digital signal reproducing circuit has jitter measuring means for calculating jitter components of the reproduction signal on the basis of the phase difference as the digital data calculated by the phase comparing means, thus enabling precise measurement of the jitter components.

In addition, the digital signal reproducing circuit has normalization means for normalizing the phase difference, thus enabling precise measurement of the jitter components of the reproduction signal even when the amplitude of the reproduction signal fluctuates.

What is claimed is:

1. A digital signal reproducing circuit comprising:
   analog/digital converting means for performing analog/digital conversion of an input signal;
   phase comparing means for comparing phase of the input signal and phase of a local clock by calculating a phase difference therebetween using a pair of sampled values in temporal proximity to an edge portion of an output signal from the analog/digital converting means, before and after said edge portion; and
   jitter measuring means for obtaining a measure of jitter by calculating unevenness of the phase difference obtained from the phase comparing means.

2. The digital signal reproducing circuit as claimed in claim 1, wherein the jitter measuring means includes normalization means for normalizing the phase difference calculated by the phase comparing means, and square average calculating means for calculating an average of square values of the phase difference normalized by the normalization means.

3. The digital signal reproducing circuit as claimed in claim 1, wherein the jitter measuring means includes normalization means for normalizing the phase difference calculated by the phase comparing means, and absolute value average calculating means for calculating an average of absolute values of the phase difference normalized by the normalization means.

4. The digital signal reproducing circuit as claimed in claim 1, further comprising waveform equalization means for performing waveform equalization of the input signal so as to output the waveform-equalized signal to the analog/digital converting means, the waveform equalization means being controlled on the basis of an output signal from the jitter measuring means.

5. The digital signal reproduction circuit as claimed in claim 3, wherein said phase comparing means further includes means for obtaining a full scale phase difference, and said normalization means normalizes the phase difference calculated by the phase comparing means by reading out a lookup table that stores values for a normalized phase difference with respect to values for said phase difference and said full scale phase difference.

6. The digital signal reproduction circuit as claimed in claim 4, wherein said phase comparing means further includes means for obtaining a full scale phase difference, and said normalization means normalizes the phase difference calculated by the phase comparing means by reading out a look up table that stores values for a normalized phase difference with respect to values for said phase difference and said full scale phase difference.

7. The digital signal reproduction circuit as claimed in claim 1, wherein said phase comparing means calculates said phase difference by subtracting a first one of said pair of sampled values from a second one of said pair of sampled values on different sides of said edge portion, with a sampling interval between the first and second samples being equal to an interval of one unit of said local clock.

8. A digital signal reproducing circuit comprising:

an analog to digital (A/D) converter for performing A/D conversion of an input signal to provide an A/D converter output signal having an edge portion;

a phase comparator configured to compare phase of the input signal and phase of a local clock by calculating a phase difference therebetween using an arithmetic operation between first and second sampled values in temporal proximity to, and on opposite sides of, said edge portion; and jitter measuring circuitry for obtaining a measure of jitter by calculating unevenness of the phase difference obtained from the phase comparator, said unevenness being calculated by normalizing the phase difference calculated by said phase comparator, processing the normalized phase difference, and integrating the processed phase difference over time.

9. The digital signal reproducing circuit of claim 8, wherein said jitter measuring circuitry processes the normalized phase difference by squaring the normalized phase difference, and integrating the squared phase difference over time.

10. The digital signal reproducing circuit of claim 8, wherein said jitter measuring circuitry processes the normalized phase difference by determining an absolute value of the normalized phase difference, and integrating the absolute values of the phase difference over time.

11. The digital signal reproducing circuit of claim 8, wherein said jitter measuring circuitry further comprises one of a counter and a timer; and wherein an integrated value is output when said counter reaches a predetermined value or said timer detects expiration of a predetermined time period.

12. The digital signal reproduction circuit of claim 8, wherein said phase comparator further includes means for determining a full scale phase difference, and said jitter measuring circuitry normalizes the phase difference by reading out a lookup table that stores values for a normalized phase difference with respect to values for said phase difference and said full scale phase difference.

13. The digital signal reproduction circuit of claim 8, wherein a sampling interval between instances of the first and second sampled values is an interval of one unit of said local clock, and said phase comparator calculates said phase difference by subtracting the first sampled value from the second sampled value.

14. The digital signal reproducing circuit of claim 8, wherein the jitter measuring circuitry is further adapted to average the integrated phase difference.

* * * * *